United States Patent [19]

Ishihara et al.

[11] Patent Number: 4,803,093

[45] Date of Patent: * Feb. 7, 1989

[54] PROCESS FOR PREPARING A FUNCTIONAL DEPOSITED FILM

[75] Inventors: Shunichi Ishihara, Ebina; Keishi Saito, Nabari; Shunri Oda, Tokyo; Isamu Shimizu, Yokohama, all of Japan

[73] Assignee: Canon Kabushiki Kaisha, Tokyo, Japan

[*] Notice: The portion of the term of this patent subsequent to Aug. 25, 2004 has been disclaimed.

[21] Appl. No.: 843,236

[22] Filed: Mar. 24, 1986

[30] Foreign Application Priority Data

Mar. 27, 1985 [JP] Japan .................. 60-62707

[51] Int. Cl.$^4$ .............................. B05D 3/06
[52] U.S. Cl. .................... 427/35; 136/258; 427/42; 427/45.1; 427/255; 427/255.1; 427/255.2; 437/5; 437/173
[58] Field of Search ............ 427/45.1, 74, 38, 39, 427/86, 42, 255.1, 255, 35, 255.2; 437/5; 136/258

[56] References Cited

U.S. PATENT DOCUMENTS

| | | | |
|---|---|---|---|
| 3,306,768 | 2/1967 | Peterson | 427/255.3 |
| 3,473,978 | 10/1969 | Jackson et al. | 427/255.1 |
| 3,825,439 | 7/1974 | Tick | 427/255.2 |
| 3,916,034 | 10/1975 | Tsuchimoto | 427/38 |
| 4,077,818 | 3/1978 | Chu | 427/248.1 |
| 4,084,024 | 4/1978 | Schumacher | 427/255.1 |
| 4,217,374 | 8/1980 | Ovshinsky et al. | 427/42 |
| 4,220,488 | 9/1980 | Duchemin et al. | 148/1.5 |
| 4,402,762 | 9/1983 | John et al. | 148/1.5 |
| 4,410,559 | 10/1983 | Hamakawa et al. | 427/39 |
| 4,419,381 | 12/1983 | Yamazaki | 427/39 |
| 4,430,185 | 2/1984 | Shimomoto et al. | 427/39 |
| 4,434,188 | 2/1984 | Kamo et al. | 427/39 |
| 4,439,463 | 3/1984 | Miller | 427/39 |
| 4,448,801 | 5/1984 | Fukuda et al. | 427/39 |
| 4,450,185 | 5/1984 | Shimizu et al. | 427/74 |
| 4,461,783 | 7/1984 | Yamazaki | 427/39 |
| 4,466,992 | 8/1984 | Dreiling | 427/39 |

(List continued on next page.)

FOREIGN PATENT DOCUMENTS

| | | | |
|---|---|---|---|
| 74212 | 3/1983 | European Pat. Off. | 427/248.1 |
| 90586 | 10/1983 | European Pat. Off. | 427/39 |
| 57-66625 | 4/1982 | Japan | 136/258 |
| 59-199035 | 4/1983 | Japan | 427/248.1 |
| 2038086A | 7/1980 | United Kingdom | 427/248.1 |
| 2148328A | 5/1985 | United Kingdom | 427/255.2 |

OTHER PUBLICATIONS

Brodsky et al., "Method of Preparing Hydrogenated Amorphous Silicon"; IBM Tech. Bull., vol. 22, No. 8A, Jan. 1980.
Janai et al., 52 J. Appl. Phys. 3622 (May 1981).

Primary Examiner—Sadie Childs
Attorney, Agent, or Firm—Fitzpatrick, Cella, Harper & Scinto

[57] ABSTRACT

Process for preparing a functional film deposited on a substrate having practically applicable characteristics which is usable as a photoconductive member in semiconductor device, image input line sensor, image pickup device on the like by generating an active species by subjecting a gaseous substance capable of being activated to generate said active species to the action of activating energy in an active species generating and transporting space leading to a film forming space containing the substrate;
  simultaneously generating a precursor by subjecting a gaseous substance capable of generating said precursor to the action of activating energy in a precursor generating and transporting space located separately from and within the active species generating and transporting space and open in a downstream region of that space; and
introducing the resulting active species and precursor into the film forming space to chemically react to form the functional deposited film on the substrate in the absence of plasma.

3 Claims, 2 Drawing Sheets

U.S. PATENT DOCUMENTS

| | | | |
|---|---|---|---|
| 4,468,413 | 8/1984 | Bachmann | 427/39 |
| 4,468,443 | 8/1984 | Shimizu et al. | 430/60 |
| 4,471,042 | 9/1984 | Komatsu et al. | 430/64 |
| 4,485,125 | 11/1984 | Izu et al. | 427/255.2 |
| 4,504,518 | 3/1985 | Ovshinsky et al. | 427/45.1 |
| 4,514,437 | 4/1985 | Nath | 427/39 |
| 4,517,223 | 5/1985 | Ovshinsky et al. | 427/39 |
| 4,521,447 | 6/1985 | Ovshinsky et al. | 427/45.1 |
| 4,522,663 | 6/1985 | Ovshinsky et al. | 427/39 |
| 4,526,805 | 7/1985 | Yashizawa | 427/39 |
| 4,532,199 | 7/1985 | Ueno et al. | 427/86 |
| 4,543,267 | 9/1985 | Yamazaki | 427/39 |
| 4,544,423 | 10/1985 | Tsuge et al. | 427/39 |
| 4,546,008 | 10/1985 | Saitoh et al. | 427/38 |
| 4,554,180 | 11/1985 | Hirooka | 427/248.1 |
| 4,564,533 | 1/1986 | Yamazaki | 427/39 |
| 4,564,997 | 1/1986 | Matsuo et al. | 427/39 |
| 4,567,127 | 1/1986 | Saitoh et al. | 430/25 |
| 4,569,697 | 2/1986 | Tsu et al. | 427/51 |
| 4,582,560 | 4/1986 | Sanjurjo | 156/623 |
| 4,615,905 | 10/1986 | Ovshinsky | 427/39 |
| 4,637,938 | 1/1987 | Lee et al. | 427/53.1 |
| 4,657,777 | 4/1987 | Hirooka | 427/39 |
| 4,664,937 | 5/1987 | Ovshinsky et al. | 427/39 |
| 4,689,093 | 8/1987 | Ishihara et al. | 427/255.1 |

PROCESS FOR PREPARING A FUNCTIONAL DEPOSITED FILM

FIELD OF THE INVENTION

This invention relates to a functional deposited film particularly usable as a photoconductive member for various semiconductor devices and to a process and an apparatus for preparing the same.

BACKGROUND OF THE INVENTION

There have been proposed a number of amorphous silicon films for use as an element member in semiconductor devices, image input line sensors, image pickup devices or the like. Some such films have been put to practical use.

Along with those amorphous silicon films, there have been proposed various methods for their preparation using vacuum evaporation technique, heat chemical vapor deposition technique, plasma chemical vapor deposition technique, reactive sputtering technique, ion plating technique and light chemical vapor deposition technique.

Among those methods, the method using heat chemical vapor deposition technique (hereinafter referred to as "CVD method") had been tried once in various sectors, but nowadays it is not used because elevated temperatures are required and a practical deposited film can not be obtained as desired.

On the other hand, the method using plasma chemical vapor deposition technique (hereinafter referred to as "plasma CVD method") has been generally recognized as being the most preferred and is currently used to manufacture amorphous silicon films on a commercial basis.

However, for any of the known amorphous silicon films, even if it is such that is obtained by plasma CVD method, there still remain problems unsolved relating to its characteristics, particularly electric and optical characteristics, deterioration resistance upon repeating use and use-environmental characteristics. The solutions to those problems must correlate with its use as an element member for the foregoing devices and also for other points such as its homogeneity, reproducibility and mass-productivity.

Now, although the plasma CVD method is widely used nowadays as above mentioned, it is still accompanied with problems since it is practiced under elevated temperature conditions. Other problems are presented in the process, including the apparatus to be used.

Regarding the former problems, because the plasma CVD method is practiced while maintaining a substrate at elevated temperature, the kind of the substrate to be used is limited to those which do not contain a material such as a heavy metal, which can migrate and sometimes cause changes in the characteristics of the deposited film to be formed. Secondly, the substrate thickness is likely to be varied on standing in the plasma CVD method. Therefore, the resulting deposited film, lacking in uniformity of thickness and in homogeneity of composition, can exhibit changed characteristics.

Regarding the latter problems, the operation conditions to be employed under the plasma CVD method are much more complicated than the known CVD method, and it is extremely difficult to generalize them.

That is, there already exist a number of variations even in the correlated parameters concerning the temperature of a substrate, the amount and the flow rate of gases to be introduced, the degree of pressure and the high frequency power for forming a layer, the structure of an electrode, the structure of a reaction chamber, the rate of flow of exhaust gases, and the plasma generation system. Besides said parameters, there also exist other kinds of parameters. Under these circumstances, in order to obtain a desirable deposited film product, it is required to choose precise parameters from a great number of varied parameters. Sometimes, serious problems occur. Because of the precisely chosen parameters, a plasma is apt to be in an unstable state. This condition often invites problems in a deposited film to be formed.

And for the apparatus in which the process using the plasma CVD method is practiced, its structure will eventually become complicated since the parameters to be employed are precisely chosen as above stated. Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy investment is firstly necessitated to set up a particularly appropriate apparatus therefor; (2) a number of process operation parameters even for such apparatus still exist and the relevant parameters must be precisely chosen from the existing various parameters for the mass-production of such film. In accordance with such precisely chosen parameters, the process must then be carefully practiced.

Against this background, there is now an increased demand for a method that makes it possible to practice the process at lower temperatures and at a high film-forming rate in a simple apparatus in order to mass-produce a desirable functional deposited film having a relevant uniformity and having many practically applicable characteristics and such that the product will be relatively inexpensive.

Likewise, there is a similar situation which exists with respect to other kinds of functional films, such as silicon:nitrogen film, silicon:carbon film and silicon:carbon film and silicon:oxygen film.

SUMMARY OF THE INVENTION

The present inventors have conducted extensive studies in order to solve the problems in the aforementioned known methods and in order to develop a new process for effectively and simply preparing a desirable functional deposited film, for instance, an amorphous silicon film, which has a wealth of practically applicable characteristics, without depending upon any known method and which meets the above-mentioned demands.

As a result, the present inventors finally have found a process that enables one to efficiently and stably form said film in simplified particular procedures as detailed below.

It is therefore an object of this invention to provide a desirable functional deposited film having many practically applicable characteristics which is usable especially as a photoconductive member for semiconductor devices, image input line sensors, image pickup devices or the like and which is prepared by chemically reacting (a) a precursor which contributes in forming said film and (b) an active species, which reacts with said precursor without plasma discharge.

Another object of this invention is to provide a process for preparing the above film using a precursor which contributes in forming the above film and an active species which can be chemically reacted with the precursor, at lower temperature and with the presence of plasma, to form the above film on a substrate in a film formation space of a closed system at a high film-forming rate.

A further object of this invention is to provide an apparatus suitable for practicing the present process.

According to one aspect of this invention, this invention aims at simplifying the film forming conditions for the preparation of a functional deposited film so as to enable mass-production of the functional deposited film while maintaining the characteristics of the film to be formed and promoting the film-forming rate at lower temperature in a film forming space without using a plasma reaction. According to a further aspect of this invention, there is provided a functional deposited film which is prepared by introducing a precursor contributing to form the above film and an active species being chemically reactive with the precursor into a film forming space, the active species being passed through a first transportation chamber (or space) leading to the film forming space and the precursor being passed through a second transportation space leading to the film forming space which is provided within the first transportation space, and chemically reacting the two substances at lower temperature in the film forming space.

According to another aspect of this invention, there is provided a process for preparing a functional deposited film, characterized in; (a) employing together a precursor contributing to form the film and an active species being chemically reactive with the precursor, (b) passing the active species through a first transportation space having a downstream portion leading to a film forming space, (c) passing the precursor through a second transportation space leading to the film forming space which is provided within the first transportation space, and (d) reacting the precursor and active species to form a film on a substrate placed in the film forming space in the absence of a plasma and without elevating the temperature of the substrate.

According to a further aspect of this invention, there is provided an apparatus suitable for practicing the above process, characterized in an active species generation chamber, an active species transporting conduit being situated at the downstream side of the active species generation chamber, a precursor generation chamber, a precursor transporting conduit being situated separately from and within the active species transporting conduit and a film formation chamber having a substrate supporting means therein.

According to this invention, since a precursor which contributes to form a deposited film and an active species chemically reactive with the precursor even at lower temperature are used, there is not any particular limitation on the kind of a substrate to be used as in the known plasma CVD method. Further, the formation of a deposited film on a substrate may be effectively carried out at a high film-forming rate without elevating the temperature of the substrate. The substrate temperature can be 80° to 120° C. lower than that of the known plasma CVD method. The process is carried out in the absence of a plasma to obtain a desirable deposited film being well fixed to the substrate.

In addition, according to this invention, control of the film-forming conditions is facilitated and quality control of the film to be prepared can be easily implemented, since the film forming space for preparing the desirable functional deposited film if spaced separately from the chamber for generating a precursor and from the chamber for generating an active species. The precursor chamber and the active species chamber are different from one another and plasma discharge is not utilized.

In this invention, an active species and a precursor are introduced into a film forming chamber respectively through an active species transporting conduit and a precursor transporting conduit. It is possible to optionally determine the length of time for the precursor to be present within the precursor transporting conduit by appropriately changing the location of its outlet portion within the active species transporting conduit, wherein the flow rate of the precursor in the precursor transporting conduit may be used as one of the key parameters to control the length of time.

And the position of the outlet to the film forming space of the precursor transporting chamber and that of the active species transporting conduit may be determined with due regard to the life span of the active species and to the life span of the precursor.

As for the position of the outlet to the film forming space from the active species transporting conduit, it is preferred to be as close as possible to the film forming region, since there are generally selected a precursor of a relatively long life span and an active species of a shorter life span than that of the precursor.

The outlet of the active species transporting conduit to the film forming space and the outlet of the precursor transporting conduit to the film forming space are preferred to be respectively in the form of either a nozzle or an orifice.

And, particularly when both the outlets are in the form of a nozzle, the efficiency of film formation and the effectiveness of feed consumption may be remarkably improved by situating the nozzle openings close to the film forming surface of a substrate in the film forming space.

In general, the active species is generated in a species activation chamber being connected to the active species transporting chamber at its upstream portion, and the precursor is generated in a precursor generation chamber being connected to the precursor transporting conduit at its upstream portion.

However, as an alternative, both the active species transporting conduit and the precursor transporting conduit may be so constructed as to double, respectively, as the active species generation chamber and the precursor generation chamber.

And in that case, the active species generation means and the precursor generation means are not always necessary to be provided separately. The related system may be so structured that a single means serves as both the active species generation means and the precursor generation means. An example of this aspect is a double conduit, such as a double glass pipe, which has an inner passage as the active species transporting conduit and an outer passage as the precursor transporting conduit. In this embodiment a microwave power source is placed around the circumference of the double conduit so as to generate an active species and a precursor in the direction of a gas current at the same time. The outlets of each of the active species transporting means and the precursor transporting means are preferred to be spaced within the film forming means.

A single or a multiple double space structural conduit having the active species transporting conduit and the precursor transporting conduit horizontally situated within the active species transporting conduit, which is connected to the film forming means horizontally situated within the active species transporting conduit, which is connected to the film forming means may be employed. In the case where multiple conduits are used to make a deposited film having a plural number of layers, each of which has a different characteristic, such may be formed on a substrate placed within the film forming space by changing the kind of the active species and/or the kind of the precursor to be introduced through each of the double space structural conduits.

Further, according to this invention, there are provided the following advantages notwithstanding that the formation of a deposited film on a substrate is carried out without elevating the temperature of the substrate and in the absence of plasma; this being distinguished from the case of the known plasma CVD method: a desirable deposited film having a uniform thickness and a desirable homogeneity may be effectively formed at an improved film forming rate without the deposited film being removed from the substrate, which is often found in the known plasma CVD method when it is practiced while the substrate is maintained at lower temperature; the deposited film formed on the substrate is not effected by any of undesirable materials removed from the inner surface of the surrounding wall of the film forming space nor by any residual gases remaining in the film forming space since the film forming chamber, the active species generation chamber and the precursor generation chamber are separate.

The term "precursor" as used in this invention means a substance which can be a constituent for forming a deposited film, but which does not or can hardly contribute to form said film, as long as it remains in its original energy state.

On the other hand, the term "active species" as used in this invention means such a substance which chemically reacts with the precursor while energizing the precursor to place the precursor in an energy state capable of contributing to the formation of the deposited film.

Therefore, for the active species, there may be used either a substance which contains one or more elements to be one or more constituents for a deposited film to be formed or another kind of substance which does not contain such elements.

The precursor which is introduced into the film forming space through the precursor transporting conduit will finally become a principal constituent to a deposited film to be formed on a substrate in the film forming means. And the preferred precursor to be used is one with a longer average life span. As the precursor, one whose average life span is preferably more than 0.01 second, more preferably more that 0.1 second and furthermore preferably more than 1.0 second is selectively used.

The active species to be introduced into the film forming means through the active species transporting conduit should be a substance having an average life span preferably less than 10 seconds, more preferably less than 8.0 seconds and most preferably less than 5.0 seconds.

When a deposited film is to be formed on a substrate in the film forming means, the active species is chemically reacted with a precursor containing one or more principal elements for the deposited film to be formed. The precursor is introduced into the film forming chamber at the same time as the active species is introduced thereinto through the active species transporting conduit, whereby a desired deposited film is easily and effectively formed on an appropriate substrate.

Since, in accordance with this invention, the deposited film may be formed without any generation of a plasma in the film forming means, the deposited film is not subjected to the influence of etching action or of other actions due to any unexpectedly occurring abnormal discharges and the like, as often found in the known plasma CVD method.

Since, the method for preparing a deposited film which is provided according to this invention is an improvement of the known CVD method, for the purpose of distinguishing from the known CVD method, the method can be appropriately categorized as the improved CVD method.

One remarkable point among others by which the improved CVD method of this invention is clearly distinguished from the known CVD method is the use of an active species which has been generated in a reactor or chamber separately situated from the film forming chamber.

Because of this feature, the present invention brings about various significant advantages compared to the known plasma CVD method, i.e. the film forming rate is greatly improved and at the same time, a deposited film superior in quality and rich in stable characteristics may be obtained. In addition, the temperature of a substrate may be made much lower than in the case of the known plasma CVD method when a deposited film is formed thereon. Further, a deposited film possessing excellent characteristics may be mass-produced on an industrial scale to thereby reduce the cost of a product.

The active species to be used in this invention is generated in the active species generation means by activating a relevant starting composition to generate the active species. For example, the starting composition may be activated by subjecting it to the action of an exciting energy of electric discharge, light or heat or by reacting or contacting it with a relevant catalyst or by adding the catalyst thereto.

Usable as the starting composition are, for example, $H_2$, $SiH_4$, $SiH_3F$, $SiH_3Cl$, $SiH_3Br$, $SiH_3I$, and the like and mixtures thereof. In addition, rare gases such as He, Ne, Ar, etc. are also usable in the starting composition.

As a precursor compound, there is generally used a silicon-containing compound which has an atom or atomic group or a polar radical which is highly electron absorptive, bonded to the silicon atom.

Said silicon containing compound is subjected to the action of an excitation energy of electric discharge, light or heat to generate the precursor in the precursor generation means.

Agents usable as the silicon containing compound are, for example, $Si_nX_{2n+2}$ (n=1, 2, 3 or more, X=F, Cl, Br, I), $(SiX_2)_n$ (n≧3, X=F, Cl, Br, I), $Si_nHX_{2n+1}$ (n=1, 2, 3 or more, X=F, Cl, Br, I), $Si_nH_2X_{2n}$ (n=1, 2, 3 or more, X=F, Cl, Br, I), etc.

Specific examples are $SiF_4$, $(SiF_2)_5$, $(SiF_2)_6$, $(SiF_2)_4$, $Si_2F_6$, $SiHF_3$, $SiH_2F_2$, $SiCl_4$, $(SiCl_2)_5$, $SiBr_4$, $(SiBr_2)_5$, and the like, which are normally in the gaseous state or can be easily gasified.

Other compounds such as $SiH_2(C_6H_5)_2$, $SiH_2(CN)_2$ and the like may be also used in accordance with the desired purpose of the deposited film to be formed. In a preferred embodiment of this invention, the precursor and the active species are well mixed in advance before being introduced into the film forming means and thereafter the mixture is introduced into the film-former. Soon after the mixture is introduced into the film former, it is possible, if desired, to apply light or heat energy to the inner atmosphere of the film former or to the substrate placed in the film former on which a deposited film is to be formed to thereby further promote the film forming rate and to further effectively and efficiently accomplish the film formation.

The volume ratio of the precursor to the active species is determined appropriately with due regard to the film forming conditions, the kind of precursor to be used and the kind of active species to be used, etc. The volume ratio is preferably 100:1 to 1:100, and, more preferably, 10:1 to 1:10 on the basis of the flow ratio.

And the position for the precursor transporting conduit outlet in the active species transporting conduit is preferably situated at a position 0.1 mm to 200 mm, more preferably, 1.0 mm to 100 mm from the position of the outlet of the active species transporting conduit.

DESCRIPTION OF THE PREFERRED EMBODIMENTS

Figure 1:
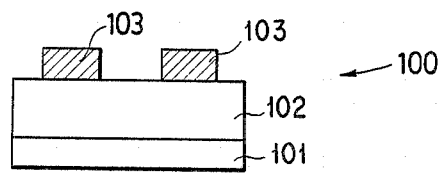
FIG. 1 is a schematic cross sectional view of an embodiment of a photoconductive member according to this invention.

FIG. 1 shows a representative structure of a photoconductive member according to this invention.

Referring to FIG. 1, photoconductive member 100 has the structure composed of photoconductive layer 102 and gap type electrodes 103, 103 on substrate 101. Substrate 101 is electrically insulating for the photoconductive member.

Usable as the substrate are, for example, films or sheets of synthetic resin such as polyester, polyethylene, polycarbonate, cellulose acetate, polypropylene, polyvinyl chloride, polyvinylidene chloride, polystyrene, polyamide and the like. Other substrate materials include glass or ceramics.

The thickness of the substrate is optional. When a flexible photoconductive member is desired, a thickness as thin as possible is preferable, but usually not less than 10 microns from a manufacturing, handling and mechanical strength point of view.

The photoconductive layer 102 has sufficient photoconductive characteristics to function as a photoconductive member. Preferably, the photoconductive layer 102 is composed of an amorphous silicon, a matrix of —SiX(H) which contains silicon atom as a main component and halogen atom(X), and hydrogen atom(H) as necessary.

Such a photoconductive layer may be prepared in the following way.

An active species generating gas, such as $H_2$, $SiH_4$ or $SiH_3F$ is introduced into the active species generation means. The gas is subjected to the action of an appropriate activation energy to generate an active species. The resulting activated species is passed through the active species transporting conduit.

Simultaneously, a precursor generating gas such as $SiF_4$, $SiF_2H_2$, etc. is introduced into the precursor generation means, and then subjected to the action of an appropriate activation energy to generate a precursor. The resulting precursor is successively passed through the precursor transporting conduit, and mixed with the above active species from the active species transporting conduit in the down stream side of the active species transporting conduit to form a gaseous mixture. The gaseous mixture is successively introduced into the inner region of the film forming chamber in which the substrate is placed while the active species and precursor are chemically reacted, whereby the electrophotoconductive layer is formed on the substrate.

In this way, a desirable photoconductive layer represented by the figure 102 in FIG. 1 may be formed.

The thickness of the photoconductive layer to be formed may be selected optionally in accordance with its application purpose and other factors of interest.

In the embodiment as shown in FIG. 1, the thickness of the photoconductive layer 102 is selected depending upon the requirements for layer of the semiconductor device. In general, the thickness of layer 102 is preferably 0.05 to 100 $\mu$m, more preferably 0.1 to 50 $\mu$m, and most preferably 0.5 to 30 $\mu$m.

The amount of H or the total amount of H and X (X=halogen atom, such as F) to be contained respectively in the photoconductive layer 102 of the photoconductive member as shown in FIG. 1 is preferably 1 to 40 atomic % and, more preferably, from 5 to 30 atomic %. For the amount of X the lower limit is 0.001 atomic %, more preferably, 0.001 atomic %, and most preferably, 0.1 atomic %.

It is possible to make the photoconductive layer 102 either n-type or p-type by appropriately doping the layer with an n-type impurity, a p-type impurity or both, while controlling the impurity amount when the layer is being formed.

Usable as impurities are, for example, elements of Group IIIA of the Periodic Table such as B, Al, Ga, In, Tl and the like for the p-type impurity, and elements of Group VA of the Periodic Table such as N, P, As, Sb, Bi and the like for the n-type impurity. Of these impurities, B, Ga, P and Sb are the most appropriate.

In order for the photoconductive layer 102 to have a desired type conductivity, the amount of an impurity with which photoconductive layer 102 is doped may be determined appropriately depending upon its desired electrical and optical characteristics.

For impurities of Group IIIA of the Periodic Table, the amount used will be less than $3 \times 10^{-2}$ atomic %, and in the case of the impurities of Group VA of the Periodic Table, the amount used will be less than $5 \times 10^{-3}$ atomic %.

The process of doping the photoconductive layer 102 with these impurities may be practiced by introducing an appropriate dopant imparting substance in the gaseous state into either the active species generation space or the precursor generation space together with a gaseous substance to generate a precursor or a gaseous starting compound to generate an active species when the layer is being formed.

As the dopant imparting substance for incorporating an impurity into the layer, a substance which is in the gaseous state at room temperature or another substance which can be easily gasified at least under the film forming conditions, may be employed.

Usable as such dopant imparting substances are, for example, $PH_3$, $P_2H_4$, $PF_3$, $PF_5$, $PCl_3$, $AsH_3$, $AsF_3$, AsF$_5$, AsCl$_3$, SbH$_3$, SbF$_5$, BiH$_3$, BF$_3$, BCl$_3$, BBr$_3$, B$_2$H$_6$, B$_4$H$_{10}$, B$_5$H$_9$, B$_5$H$_{11}$, B$_6$H$_{10}$, B$_6$H$_{12}$, AlCl$_3$, and the like.

Gap electrodes 103,103 may be formed after the photoconductive layer 102 as been formed. In reverse, it is also possible to form the photoconductive layer 102 after the gap electrodes 103,103 have been formed on the substrate 101.

In the formation of the electrodes, while conductive materials may be used, such conductive materials capable of providing an ohmic contact with the photoconductive layer 102 are desirable.

As the latter conductive materials, metals such as Al, In and the like whose work function is low, or a low-resistivity a—SiX(H) film which has been doped with a large amount (usually more than 100 ppm) of an element of Group VA of the Periodic Table, such as P or As, may be used and especially in the case where non-doped a—SiX(H) is used as the photoconductive layer 102.

The advantages of this invention are now described in more detail by reference to the following Examples, which are provided here for illustrative purposes only, and are not intended to limit the scope of this invention.

EXAMPLE 1

Figure 2:
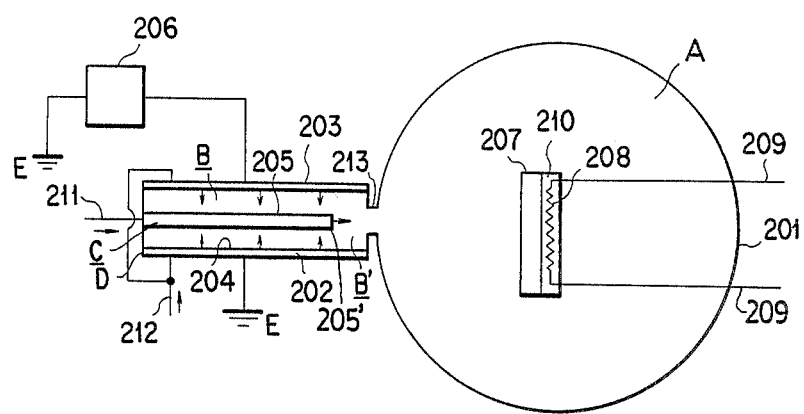
FIG. 2 is a schematic diagram of an apparatus suitable for practicing the process for preparing a photoconductive member according to this invention.

A photoconductive and functional deposited film was formed on a plane substrate in accordance with the procedures as below illustrated by using an apparatus as shown in FIG. 2.

In FIG. 2, film forming chamber 201 having inner space A in which substrate holder 210 for substrate 207 having electric heater 208 being connected to power source (not shown) with lead wires 209,209, is provided.

The film forming chamber is provided with an exhaust pipe (not shown) being connected through a main valve to an exhaust device. The exhaust pipe is provided with a valve (not shown) serving to break vacuum in the film forming chamber.

Active species transporting conduit B also acts as an activation space in which to generate an active species. Conduit B has mixing region B' situated at the downstream side. Conduit B opens into film forming space A through nozzle means 213. Feeding pipe 212 of an active species generation starting compound is connected to the active species transportation space through circumferential wall D. Wall D has therein active species generation composition passage 202 formed by outer wall 203 and inner wall 204 having the plural number of gas liberation holes (not shown).

Precursor transporting conduit 205 is open at one end adjacent to mixing region B'. The position of the opening 205' of the conduit 205 is situated about 7 cm distant from the nozzle means 213. Conduit 205 has inner passage C to which precursor generative substance feeding pipe 211 is connected.

Microwave power source 206 is electrically connected to outer wall 203.

As the substrate 207, a glass plate of 1 mm in thickness and 10 cm×5 cm in size was used.

The glass plate was treated with a 1% solution of NaOH, washed with water then air-dried. This glass plate was firmly disposed to the surface of the substrate holder 210 placed at a predetermined position in the film forming chamber 209. The air in the film forming chamber 201 and the active species transporting conduit B was evacuated by opening the main valve (not shown) to bring the chamber and the space to a vacuum of about $1\times10^{-5}$ Torr. Then, heater 208 was actuated to heat uniformly the glass plate (substrate) 207° to 300° C., and the plate was maintained at this temperature.

In parallel, H$_2$ gas (as the active species generative compound) was fed at a flow rate of 50 SCCM into passage 202, passed into the space B through the gas liberation holes (not shown) of the inner wall 204, and SiH$_4$ gas (100%) (as the precursor generative substance) was fed at a flow rate of 100 SCCM into the inner space C. After the flow amount of the two gases became stable, the vacuum in film forming chamber 201 was brought to and maintained at about 0.002 Torr by regulating the main valve.

Microwave power source 206 was switched on to apply a discharge energy of 200 W into both space B and inner space C.

After 20 minutes, there was found that an a—Si:H:F film of about 1.0 μm in thickness was formed uniformly on the glass plate in the film forming chamber 201.

A comb line Al electrode of 2.5 cm gap length and 0.2 mm gap interval was fixed at a thickness of about 500 Å onto the a—Si:H:F film in accordance with known vacuum evaporation techniques to thereby obtain a photoconductive member.

An electric current was measured by impressing a voltage on the resulting member.

As a result, it was found that the ratio of electric current under light irradiation to electric current under dark conditions was a $1\times10^{3.5}$.

There was no change in this numerical value, even after light irradiation for 24 hours.

In a comparative example, an a—Si:H:F film was formed according to the known plasma CVD method, and a comb line Al electrode was fixed onto this a—Si:H:F film in the same way as above mentioned to thereby obtain a photoconductive member.

This comparative member was examined by the same procedure as mentioned above. As a result, it was found that the ratio of electric current under light irradiation to that under a dark condition for the member was $1\times10^{3.4}$ at the beginning, but decreased to $1\times10^{2.3}$ after light irradiation for 24 hours.

EXAMPLE 2

The procedure of Example 1, wherein the position of the opening of conduit 213 was varied as shown in Table 1, was repeated to obtain a series of deposited films. The deposited films were evaluated ass photosensitive members.

The flow of H$_2$ gas, as the active species generative compound to be introduced into the space B, was regulated at 300 SCCM. Likewise, the flow of SiF$_4$ gas as the precursor generative substance to be introduced was regulated at 300 SCCM. A discharge energy of 300 W was applied. The vacuum of the film forming chamber was 0.002 Torr.

The results of the evaluation on the resulting deposited films were as shown in Table 1.

TABLE 1

| The distance of the conduit opening 205 from nozzle 213 (mm) | 0.05 | 1 | 20 | 70 | 100 | 200 | 300 |
|---|---|---|---|---|---|---|---|
| Characteristics of a deposited film as obtained |  | ● | ● | ● | ● |  | X |

● Very suitable as a photosensitive member
  Usable as a photosensitive member
X Not usable as a photosensitive member

We claim:

1. A process for preparing a functional deposited film on a substrate, said process employing (i) a precursor as a constituent for the film which precursor is substantially nonreactive as long as it remains in its original energy state and (ii) an active species which can react with and impart energy to the precursor to activate the precursor to a state capable of contributing to formation of said film, said process comprising the steps of:

(a) generating said active species by subjecting a gaseous substance capable of being activated to generate said active species to the action of activating energy sufficient to generate said active species in an active species generating and transporting space leading to a film forming space containing the substrate;

(b) simultaneously generating said precursor by subjecting a gaseous substance capable of generating said precursor to the action of activating energy sufficient to generate said precursor in a precursor generating and transporting space located separately from and within the active species generating and transporting space and open in a downstream region of that space; and (c) introducing the resulting active species and precursor into the film forming space to chemically react to form the functional deposited film on the substrate in the absence of a plasma.

2. A process for preparing a functional deposited film according to claim 1, including employing as the active species, a material which is generated by subjecting a member selected from the group consisting of $H_2$, $SiH_4$, $SiH_3F$, $SiH_3Cl$, $SiH_3Br$ and $SiH_3I$ to the action of microwave energy and employing as the precursor, a material which is generated by subjecting a member selected from the group consisting of $Si_nX_{2n+2}$ (n=1, 2, 3 or more, X=F, Cl, Br or I), $(SiX_2)_n$ (n≧3, X=F, Cl, Br or I), $Si_nHX_{2n+1}$ (n=1, 2, 3 or more, X=F, Cl, Br or I) and $Si_nH_2X_{2n}$ (n=1, 2, 3 or more, X=F, Cl, Br or I) to the action of microwave energy.

3. A process for preparing a functional deposited film according to claim 1, including mixing the active species and the precursor prior to introducing them into the film forming space.

* * * * *

UNITED STATES PATENT AND TRADEMARK OFFICE
CERTIFICATE OF CORRECTION

PATENT NO. : 4,803,093
DATED : February 7, 1989
INVENTOR(S) : SHUNICHI ISHIHARA, ET AL.    Page 1 of 3

It is certified that error appears in the above-identified patent and that said Letters Patent is hereby corrected as shown below:

IN [57] ABSTRACT

Line 5, "on" should read --or--.

COLUMN 1

Line 44, "reproductibility" should read
            --reproducibility--.

COLUMN 2

Line 42, "silicon:carbon" (second occurrence)
            should be deleted.
    Line 43, "film and" should be deleted.

COLUMN 3

Line 18, "reaction.  According" should read
            --reaction.  ¶ According--.
    Line 32, "in;" should read --in:--.

COLUMN 4

Line 3, "if" should read --is--.

COLUMN 5

Line 28, "effected" should read --affected--.

UNITED STATES PATENT AND TRADEMARK OFFICE
CERTIFICATE OF CORRECTION

PATENT NO. : 4,803,093
DATED : February 7, 1989
INVENTOR(S) : SHUNICHI ISHIHARA, ET AL.     Page 2 of 3

It is certified that error appears in the above-identified patent and that said Letters Patent is hereby corrected as shown below:

COLUMN 6

Line 14, "Since," should read --Since--.

COLUMN 7

Line 25, "cross sectional" should read --cross-sectional--.

COLUMN 8

Line 6, "down stream" should read --downstream--.
　　Line 30, "0.001 atomic %," should read --0.01 atomic %,--.

COLUMN 9

Line 4, "as" should read --has--.

COLUMN 10

Line 1, "(substrate) 207°" should read --(substrate) 207--.
　　Line 19, "comb line Al electrode" should read --comblike Al electrode--.
　　Line 28, "a" should be deleted.
　　Line 33, "comb line Al electrode" should read --comblike Al electrode--.
　　Line 45, "conduit 213" should read --nozzle 213--.
　　Line 47, "ass" should read --as--.

UNITED STATES PATENT AND TRADEMARK OFFICE
CERTIFICATE OF CORRECTION

PATENT NO. : 4,803,093

DATED : February 7, 1989

INVENTOR(S) : SHUNICHI ISHIHARA, ET AL.   Page 3 of 3

It is certified that error appears in the above-identified patent and that said Letters Patent is hereby corrected as shown below:

COLUMN 10

Table 1, "Characteristics of a deposited film as obtained  . . . .   X" should read --Characteristics of a deposited film as obtained ✓ . . . . ✓ X--   and "Usable as a photosensitive member" should read
-- ✓ Usable as a photosensitive member--.

Signed and Sealed this

Seventh Day of November, 1989

Attest:

JEFFREY M. SAMUELS

Attesting Officer     Acting Commissioner of Patents and Trademarks